United States Patent [19]
Yanagihara

[11] Patent Number: 5,886,858
[45] Date of Patent: Mar. 23, 1999

[54] MAGNETIC DISK APPARATUS WITH FLEXIBLE PRINTED CIRCUIT BOARD CONNECTED TO CARRIAGE ASSEMBLY

[75] Inventor: Shigeki Yanagihara, Tokorozawa, Japan

[73] Assignee: Kabushiki Kaisha Toshiba, Kawasaki, Japan

[21] Appl. No.: 928,300

[22] Filed: Sep. 12, 1997

[30] Foreign Application Priority Data

Mar. 28, 1997  [JP]  Japan ................................. 9-078256

[51] Int. Cl.⁶ ........................................................ G11B 5/55
[52] U.S. Cl. ................................................................ 360/106
[58] Field of Search ............................................ 360/106

[56] References Cited

U.S. PATENT DOCUMENTS

| | | |
|---|---|---|
| 5,539,596 | 7/1996 | Fontana et al. ........................ 360/106 |
| 5,550,694 | 8/1996 | Hyde ........................................ 360/104 |
| 5,579,190 | 11/1996 | Mastache et al. ...................... 360/106 |
| 5,680,277 | 10/1997 | Bonn ........................................ 360/106 |

*Primary Examiner*—A. J. Heinz
*Attorney, Agent, or Firm*—Limbach & Limbach LLP

[57] ABSTRACT

A main FPC comprises a board body having a conductor pattern thereon. An extended end portion of the board body includes a junction, which is provided with a large number of connecting pads, and first and second extension sections extending in opposite directions from the junction. A reinforcing plate is stuck on the back of the extension sections and the junction. A mounting section that extends at right angles to the junction is formed by bending the fist and second extension sections and part of the reinforcing plate. Apertures are formed in the mounting section, and the mounting section is fixed to a carriage assembly by being clamped together with a bearing section of the carriage assembly that is passed through the apertures.

8 Claims, 8 Drawing Sheets

MAGNETIC DISK APPARATUS WITH FLEXIBLE PRINTED CIRCUIT BOARD CONNECTED TO CARRIAGE ASSEMBLY

BACKGROUND OF THE INVENTION

The present invention relates to a magnetic disk apparatus, and more particularly, to a magnetic disk apparatus in which magnetic heads supported by a carriage assembly are connected to a control unit through a flexible printed circuit board.

In general, a magnetic disk apparatus comprises magnetic disks arranged in a casing, a spindle motor for supporting and rotating these disks, a carriage assembly that support magnetic heads, a voice coil motor for driving the carriage assembly, a substrate unit, etc.

The carriage assembly includes a bearing section attached to the casing and a plurality of arms extending from the bearing section. A magnetic head is mounted on each arm by means of a suspension. Signal wires for the magnetic heads are led along the arms to the bearing section, and are soldered one by one to one end portion of a main flexible printed circuit board (hereinafter referred to as main FPC). Alternatively, the signal wire for each magnetic head is connected to the main FPC through a junction FPC mounted on each corresponding arm. The other end portion of the main FPC is connected to the substrate unit. Thus, the magnetic heads are connected electrically to the substrate unit through the main FPC, and are controlled by means of the substrate unit.

Usually, the one end portion of the main FPC is fixed to the carriage assembly by a method (1) in which it is fixed by means of a screw that is screwed into an internal screw on the carriage assembly side through an aperture formed in the main FPC, a method (2) in which the one end portion is stuck on the carriage assembly with use of a double-coated adhesive tape or an adhesive, or a method (3) that combines those two methods.

With use of the method (1), a grounding conductor pattern formed on the main FPC can be easily grounded to the carriage assembly. In this case, however, an area for the connection of the magnetic head signal wires is narrowed by a margin equivalent to the area of the head of the fixing screw, and the magnetic head signal wires must be arranged without interfering with the screw head, so that the position for the connection and the like are restricted. In recent years, in particular, high-performance magnetic heads are frequently used with an increasing demand for higher recording density. According to this method, therefore, the magnetic heads require use of more signal wires, and this requirement cannot be fulfilled with ease.

With use of the method (2), on the other hand, there is a possibility of the main FPC separating from the carriage assembly, owing to change of temperature, vibrations, shocks, seek of the carriage assembly, etc. Thus, this method lacks in reliability.

It is difficult for the method (3), moreover, to solve the problems of the foregoing methods.

BRIEF SUMMARY OF THE INVENTION

The present invention has been contrived in consideration of these circumstances, and its object is to provide a magnetic disk apparatus, in which a main FPC can be securely attached to a carriage assembly without reducing an area for the connection of the main FPC to signal wires for magnetic heads.

In order to achieve the above object, a magnetic disk apparatus according to the present invention comprises a magnetic head for recording on and retrieving information from a magnetic disk, a carriage assembly supporting the magnetic head for movement with respect to the magnetic disk, and a flexible printed circuit board having one end portion attached to the carriage assembly and the other end portion connected to a substrate unit and connecting the magnetic head electrically to the substrate unit.

The carriage assembly includes a bearing section and a plurality of arms stacked on the bearing section, extending from the bearing section, and supporting the magnetic head each, and the flexible printed circuit board includes a board body having a conductor pattern thereon and a reinforcing plate stuck on one end portion of the board body, the one end portion of the board body and the reinforcing plate having a mounting section attached to the bearing section in a manner such that the mounting section and the arms are arranged together in layers.

According to this magnetic disk apparatus of the invention, the conductor pattern of the board body includes a grounding section led out to the mounting section and conducting to the carriage assembly.

According to this magnetic disk apparatus of the invention, moreover, the one end portion of the board body includes a junction provided with a plurality of connecting pads and an extension section extending from the junction and constituting the mounting section, the reinforcing plate is stuck on the junction and the extension section, and the mounting section includes an aperture formed in the extension section and the reinforcing plate and penetrated by the bearing section.

According to this magnetic disk apparatus of the invention, furthermore, the one end portion of the board body includes a junction provided with a plurality of connecting pads and a pair of extension sections extending from the junction and individually constituting the mounting section, and the mounting section is formed by bending the extension sections and the reinforcing plate stuck thereon.

In this case, the pair of extension sections are bent so as to be in contact with each other, thereby forming a single mounting section, or bent so as to be spaced, thereby forming a pair of mounting sections.

Further, the conductor pattern of the board body includes a grounding section extending to at least one of the extension sections so as to surround the aperture and conducting to the carriage assembly.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 1 to 9 show a hard disk drive (HDD) according to an embodiment of the present invention, in which:

FIGS. 10A to 10C show a first modification of a mounting section of the main FPC, in which:

FIGS. 11A to 11C show a second modification of the mounting section of the main FPC, in which:

FIGS. 12A to 12C show a third modification of the mounting section of the main FPC, in which:

DETAILED DESCRIPTION OF THE INVENTION

An embodiment in which a magnetic disk apparatus according to the present invention is applied to a hard disk drive (hereinafter referred to as HDD) will now be described in detail with reference to the accompanying drawings.

Figure 1:
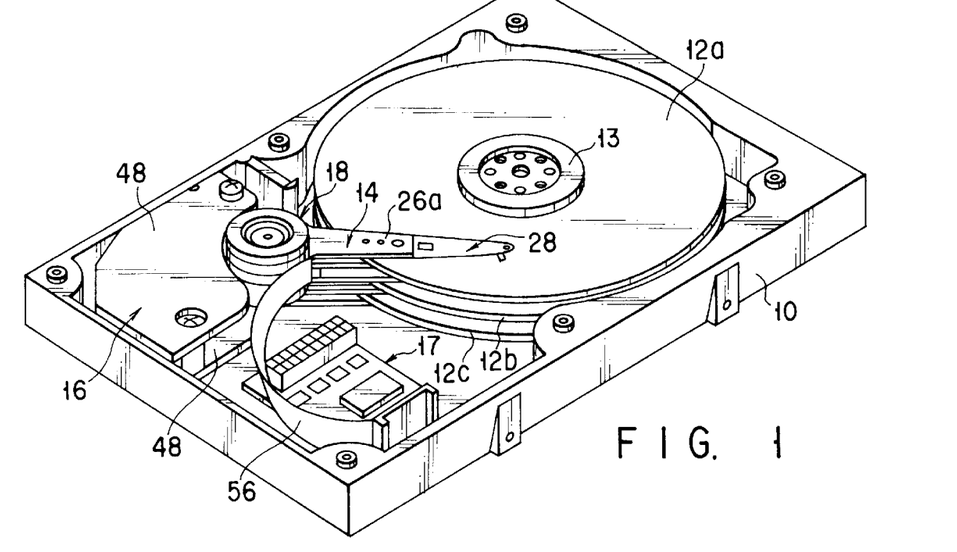
FIG. 1 is a perspective view showing the interior of the HDD.

As shown in FIG. 1, the HDD includes a casing 10 in the form of an open-topped rectangular box and a top cover (not shown), which is fixed to the casing by means of screws so as to close its top opening.

The casing 10 contains therein three magnetic disks 12a, 12b and 12c for use as magnetic recording media, a spindle motor 13 for supporting and rotating these disks, a plurality of magnetic heads for recording on and retrieving information from the magnetic disks. The casing 10 further contains a carriage assembly 14 that supports the magnetic heads for movement with respect to the magnetic disks 12a, 12b and 12c, a voice coil motor (hereinafter referred as VCM) 16 for rotating and positioning the carriage assembly, and a substrate unit 17 that includes a preamplifier and the like.

A printed circuit board (not shown) for controlling the operations of the spindle motor 13, VCM 16, and magnetic heads through the substrate unit 17 is screwed to the outer surface of the casing 10, and is opposed to the bottom wall of the casing.

The magnetic disks 12a, 12b and 12c are formed having a diameter of 65 mm (or 2.5 inches), and is provided with magnetic recording layers on its upper and lower surfaces, individually. These three disks are fitted coaxially in a hub (not shown) of the spindle motor 13, and are arranged in layers at predetermined intervals in the axial direction of the hub. The disks 12a, 12b and 12c are rotated at a given speed by the motor 13.

As shown in FIGS. 1 to 4, the carriage assembly 14 is provided with a bearing assembly 18 fixed on the bottom wall of the casing 10. The bearing assembly 18, which serves as a bearing section, includes a pivot 20 set up the bottom wall of the casing 10 and a cylindrical hub 22 rotatably supported on the pivot by means of a pair of bearings. A ring-shaped flange 23 is formed on the upper end of the hub 22, while a screw portion 24 is formed on the outer periphery of the lower end portion of the hub.

Figure 2:
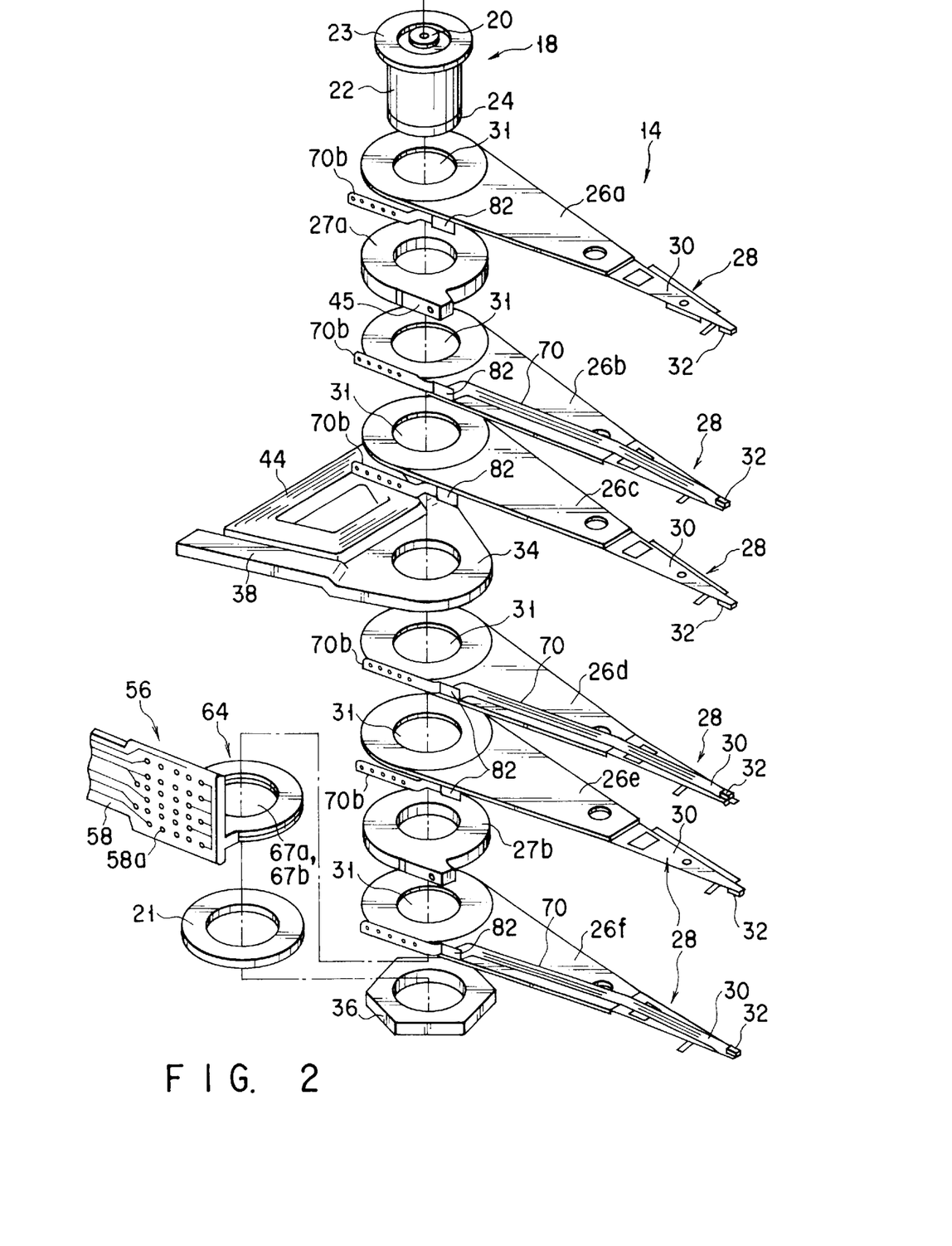
FIG. 2 is an exploded perspective view of a carriage assembly attached to the HDD.

Further, the carriage assembly 14 is provided with six arms 26a, 26b, 26c, 26d, 26e and 26f and two spacer rings 27a and 27b mounted on the hub 22, one washer 21, and six magnetic head assemblies 28 supported individually on the arms.

Each of the arms 26a to 26f is a thin sheet of about 250 $\mu$m thickness formed of a stainless-steel-based material, such as SUS 304. A circular through hole 31 is bored through one end or proximal end of each arm.

Each magnetic head assembly 28 includes an elongate suspension 30 and a magnetic head 32 fixed thereto. The suspension 30 is formed of a leaf spring with a thickness of 60 to 70 $\mu$m, and its proximal end is fixed to the distal end of its corresponding one of the arms 26a to 26f by spot welding or bonding, and extends from the arm.

Each magnetic head 32 includes a substantially rectangular slider (not shown) and an MR (magnetic resistance) head for recording and reproduction, and is fixed to a gimbals portion that is formed on the distal end portion of the suspension 30. Also, each magnetic head 32 has four electrodes (not shown). The suspension 30 may be formed of the same material as the arm so as to be integral therewith. The suspensions 30 and the arms constitute an arm section according to the present invention.

The arms 26a to 26f, to which the magnetic head assemblies 28 are fixed individually, are fitted on the hub 22 in a manner such that they are arranged in layers on the flange 23 as the hub is passed through their respective through holes 31. The spacer rings 27a and 27b are fitted on the hub 22 so that they are sandwiched between the arms 26a and 26b and between the arms 26e and 26f, respectively. Further, a support ring 34 is fitted on the hub 22 so as to be interposed between the arms 26c and 26d.

The bearing assembly 18, spacer rings 27a and 27b, and support ring 34 constitute the body structure of the carriage assembly 14.

The six arms 26a to 26f, two spacer rings 27a and 27b, and support ring 34, which are fitted on the hub 22, are sandwiched between the flange 23 and a nut 36 that is screwed on the screw portion 24 of the hub 22 with the aid of the washer 21, and are fixedly held on the outer circumferential surface of the hub 22. Thus, the arms 26a to 26f are spaced and extend parallel to each other in the same direction from the hub 22.

The respective magnetic heads 32 of those magnetic head assemblies 28 which are attached to the arms 26a and 26b are opposed to each other. Likewise, the respective magnetic heads 32 of those magnetic head assemblies 28 which are attached to the arms 26c and 26d are opposed to each other, and the respective magnetic heads 32 of those magnetic head assemblies 28 which are attached to the arms 26e and 26f are opposed to each other. The arms 26a to 26f and the magnetic head assemblies 28 fixed thereto are rockable integrally with the hub 22.

The support ring 34 has two support frames 38, which extend in the direction opposite from the arms 26a to 26f, and a coil 44 that constitutes part of the VCM 16 is fixed on these support frames.

When the carriage assembly 14 constructed in this manner is incorporated in the casing 10, as seen from FIG. 1, the magnetic disks 12a, 12b and 12c are situated between the arms 26a and 26b, between the arms 26c and 26d, and between the arms 26e and 26f, respectively.

Those magnetic heads 32 which are attached to the arms 26a and 26b are in contact with the upper and lower surfaces of the magnetic disk 12a, respectively, and hold the disk 12a from both sides. Likewise, those magnetic heads 32 which are attached to the arms 26c and 26d are in contact with the upper and lower surfaces of the magnetic disk 12b, respectively, and hold the disk 12b from both sides. Further, those magnetic heads 32 which are attached to the arms 26e and 26f are in contact with the upper and lower surfaces of the magnetic disk 12c, respectively, and hold the disk 12c from both sides. Each magnetic head 32 is subjected to a given head load by means of the spring force of the suspension 30, and is pressed against the surface of its corresponding magnetic disk when the disk is held at a standstill.

When the carriage assembly 14 is incorporated in the casing 10 in the manner shown in FIG. 1, on the other hand, the coil 44, which is fixed to the support frames 38, is situated between a pair of yokes 48 that are fixed on the casing 10. Along with these yokes 48 and a magnet (not shown) that is fixed to one of the yokes, the coil 44 constitutes the VCM 16. When the coil 44 is energized, the carriage assembly 14 rocks, whereupon the magnetic heads 32 are moved to and positioned on desired tracks of the magnetic disks 12a, 12b and 12c, individually.

Figure 5:
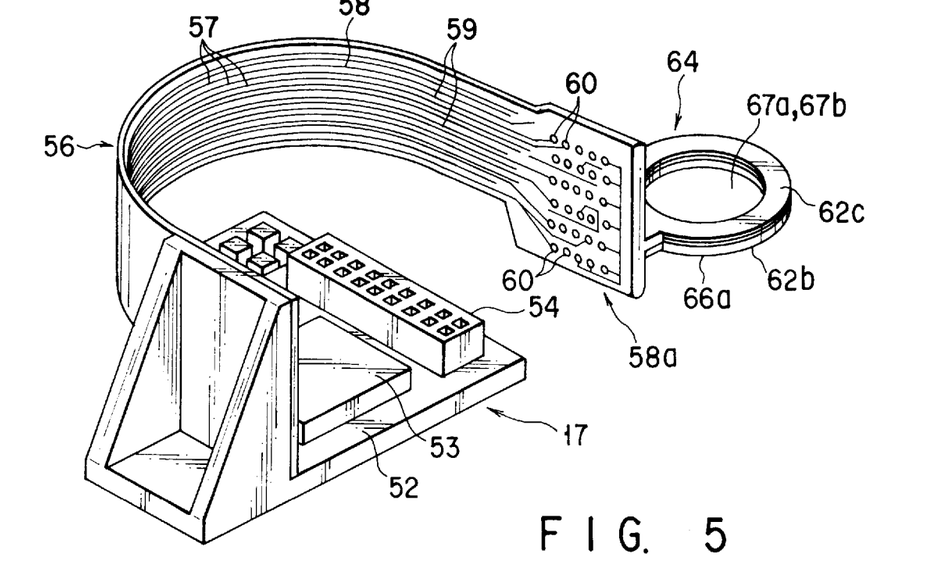
FIG. 5 is a perspective view showing a substrate unit of the HDD.

As shown in FIGS. 1 and 5, the substrate unit 17 includes a rectangular circuit board 52 that is fixed on the bottom wall of the casing 10, and a plurality of electronic components 53, connector 54, etc. are mounted on the circuit board. Also, the substrate unit 17 includes a belt-shaped main flexible printed circuit board (hereinafter referred to as main FPC) 56, which electrically connects the circuit board 52 and the carriage assembly 14. The main FPC 56, which functions as a flexible printed circuit board, is composed of a belt-shaped board body 58 extending from the circuit board 52 and a reinforcing plate 62 (mentioned later) that is stuck on the back of an extended end (other end portion) of the board body.

The board body 58 includes a base film of an insulating material such as polyimide, a conductor pattern 57 obtained by patterning a copper leaf formed on the base film, and a cover layer or a solder resist layer of an insulating material that covers the whole area of the pattern 57 and the base film except connecting pads (mentioned later) of the pattern. One end portion of the board body 58 is formed integrally with the circuit board 52.

Figure 6:
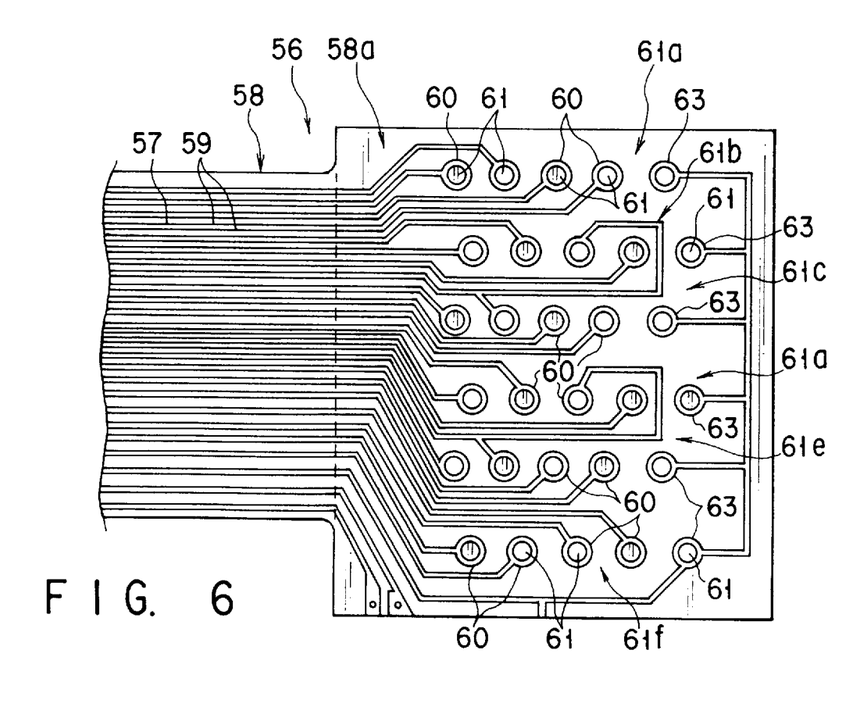
FIG. 6 is a plan view showing a junction of a main FPC of the substrate unit.

As shown in FIGS. 5 and 6, the conductor pattern 57 of the board body 58 includes a large number of conductive lines 59, which extend parallel to one another in the axial direction of the FPC. The extended end portion of the board body 58 is formed having connecting pads 60 in six sets 61a to 61f, which correspond in number to the magnetic heads 32, thus constituting a junction 58a. The pads 60 electrically conduct to the circuit board 52 by means of the conductive lines 59, individually.

The connecting pads 60 in each set are four in number, corresponding to the number of electrodes of each magnetic head 32, and are arranged straight at regular intervals in the axial direction of the FPC 56, for example. The connecting pads 60 in the sets 61a to 61f are arranged parallel to one another and at predetermined intervals in a direction perpendicular to the axial direction of the FPC 56.

Each of the sets 61a to 61f is composed including an auxiliary pad 63 for reinforcement that is located in line with its corresponding connecting pads 60. The connecting pads 60 and the auxiliary pad 63 are circular in shape, for example, and their respective surfaces are precoated with the spare solder layer 61 each.

Figure 7A:
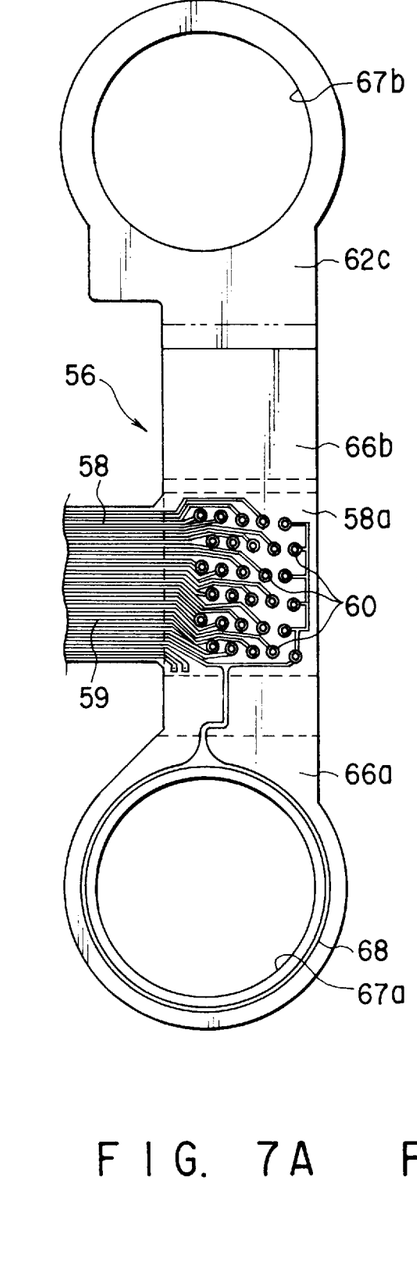
FIG. 7A is a developed plan view showing the junction and extension sections of the main FPC.
Figure 7B:
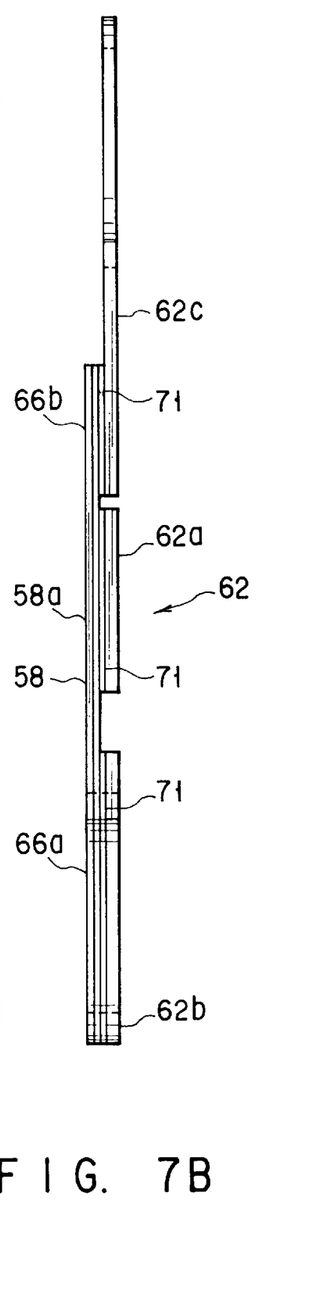
FIG. 7B is a developed side view showing the junction and the extension sections of the main FPC.
Figure 8:
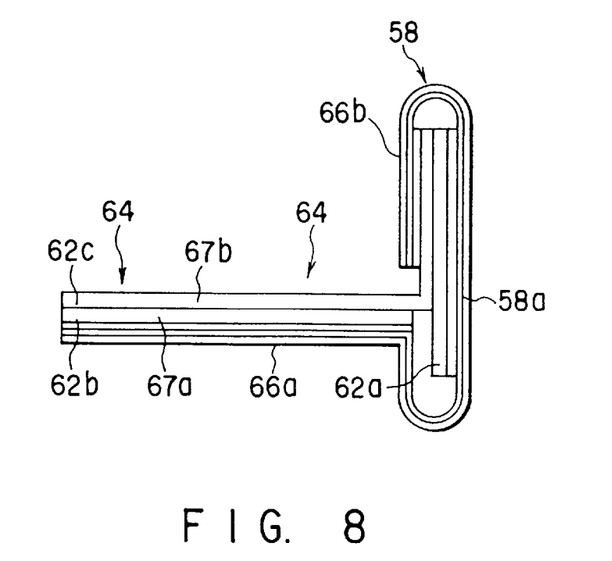
FIG. 8 is a front view of the main FPC showing a mounting section formed by bending the extension sections of the main FPC.

Further, the main FPC 56 includes a mounting section 64 that extends at right angles to the junction 58a, and is attached to the carriage assembly 14 by means of the mounting section. More specifically, the extended end portion of the board body 58 includes first and second extension sections 66a and 66b that extend from the junction 58a at right angles thereto and in directions opposite from each other, as shown in FIGS. 7A and 7B. The first extension section 66a extends longer enough than the second extension section 66b.

Furthermore, the reinforcing plate 62 of, e.g., stainless steel, is stuck on the extended end portion of the board body 58 with use of a thermosetting adhesive 71. The plate 62 is composed of a first portion 62a stuck on the back of the junction 58a, a second portion 62b stuck on the back of the first extension section 66a, and a third portion 62c stuck on the back of the second extension section 66b. The third portion 62c extends outward beyond the second extension section 66b. The first, second, and third portions 62a, 62b and 62c of the reinforcing plate 62 are stuck on the board body 58 at predetermined intervals.

The first extension section 66a of the board body 58 and the second portion 62b of the reinforcing plate 62 are formed having a circular first aperture 67a. Likewise, the extended end portion of the third portion 62c of the plate 62 is formed having a circular second aperture 67b. These first and second apertures have the same diameter. The conductor pattern 57 of the board body 58 includes a grounding section 68 that is formed on the first extension section 66a and extends around the first aperture 67a. The grounding section 68 is plated with, for example, solder, whereby it is protected against corrosion.

The main FPC 56 is obtained by punching out the board body 58 and the reinforcing plate 62 stuck thereon by means of a die or the like.

As shown in FIGS. 5, 7A, 7B and 8, the second and third portions 62b and 62c of the reinforcing plate 62 are brought intimately into contact with each other and made to extend at right angles to the junction 58a of the board body 58 by bending the first and second extension sections 66a and 66b along gap portions of the plate 62 and bending the third portion 62c of the plate 62 at right angles in the middle. Also, the first extension section 66a of the board body 58 extends at right angles to the junction 58a. Further, the first and second apertures 67a and 67b are aligned coaxially with each other. The second and third portions 62b and 62c of the reinforcing plate 62 and the first extension section 66a of the board body 58 constitute the mounting section 64.

Figures 3, 4:
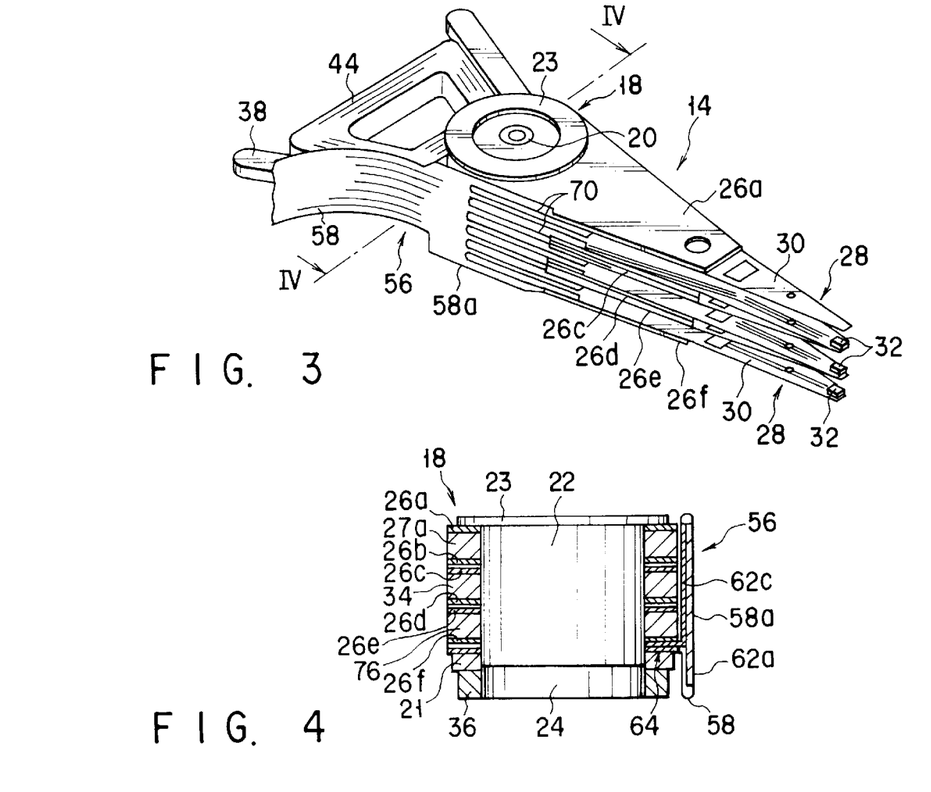
FIG. 3 is a perspective view of the carriage assembly.
FIG. 4 is a sectional view taken along line IV—IV of FIG. 3.

The extended end portion of the main FPC 56, constructed in this manner, is fixed to the carriage assembly 14 by arranging the mounting section 64 and the arms of the assembly 14 in layers on the hub 22 of the bearing assembly 18, as shown in FIG. 4. More specifically, the mounting section 64 is fixed to the bearing assembly 18 in a manner such that the hub 22 of the bearing assembly is passed through the first and second apertures 67a and 67b and that the mounting section is interposed between the arm 26f and the washer 21 and clamped together with them by means of the nut 36. The junction 58a of the board body 58 is kept adjacent and opposite to the bearing assembly 18. The main FPC 56 conducts to the carriage assembly 14 with the grounding section 68 of the mounting section 64 in contact with the washer 21.

Figure 9:
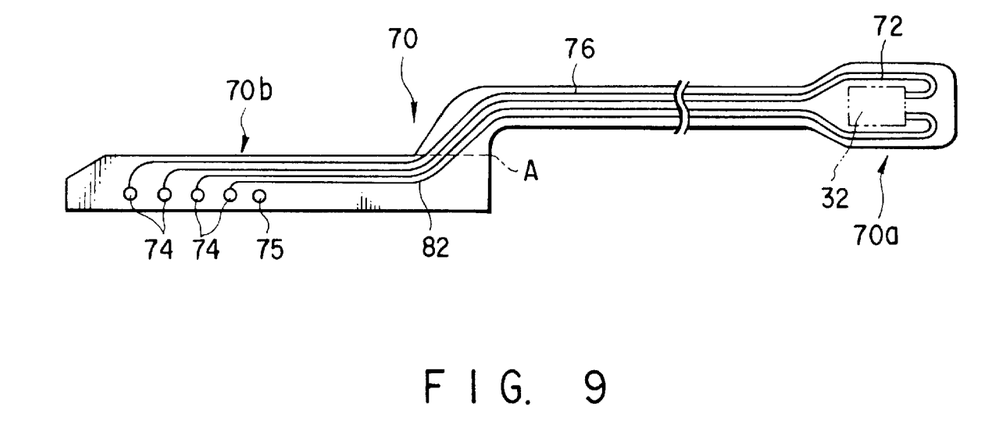
FIG. 9 is a plan view showing a junction FPC.

On the other hand, each magnetic head 32 of the carriage assembly 14 is connected electrically to its corresponding connecting pad set of the main FPC 56 through a junction flexible printed circuit board (hereinafter referred to as junction FPC) 70. As shown in FIGS. 2, 3 and 9, the junction FPC 70 is spot-welded to the surfaces of each corresponding arm and suspension 30, and extends from the distal end of the suspension to the proximal end of the arm.

The junction FPC 70 is in the form of an elongate belt as a whole, and includes a distal end portion 70a situated at the distal end of the suspension 30 and a connecting end portion 70b led out from the proximal end of the arm. The distal end portion 70a is provided with four first electrode pads 72, which are connected electrically to their corresponding electrodes of the magnetic head 32. The connecting end portion 70b is provided with four second electrodes 74 and one auxiliary pad 75. Each second electrode pad 74 electrically conducts to its corresponding first electrode pad 72 by means of a conductive line 76.

A stainless-steel sheet (not shown, hereinafter referred to as flexure) of 30 μm thickness is stuck on the whole area of the back of the junction FPC 70 except the connecting end portion 70b. The junction FPC 70 is fixed to the carriage assembly 14 with the flexure in contact with the respective surfaces of the arm and the suspension 30.

Further, the junction FPC 70 includes a bent portion 82 at that end of the flexure which is situated on the side of the connecting end portion 70b. The bent portion 82 is bent at right angles along a bending line A represented by broken line in FIG. 9. Thus, as shown in FIGS. 2 and 3, the connecting end portion 70b of each junction FPC 70 extends at right angle to the surface of its corresponding arm and parallel to the extended end portion 56a of the main FPC 56 that is fixed to the bearing assembly 18.

The connecting end portion 70b is in the form of an elongate rectangle that extends in the extending direction of the arm, that is, in the longitudinal direction of the main FPC 56. The four second electrode pads 74 are arranged at predetermined intervals in the longitudinal direction of the main FPC 56, and are oriented in the same manner as the four connecting pads 60 in their corresponding set of the main FPC 56, in particular. As shown in FIG. 3, the connecting end portion 70b of each junction FPC 70 is connected electrically and mechanically to the junction 58a of the main FPC 56 by soldering the second electrode pads 74 individually to the connecting pads 60 in their corresponding set of the main FPC 56.

Each magnetic head 32 is connected electrically to the substrate unit 17 through its corresponding junction FPC 70 and the main FPC 56 by connecting the connecting end portion 70b of the junction FPC to the main FPC 56 in the aforesaid manner.

The auxiliary pad 75 attached to each connecting end portion 70b is soldered to its corresponding auxiliary pad 63 at the junction 58a of the main FPC 56, whereby the strength of connection of the end portion 70b to the main FPC is enhanced.

According to the HDD constructed in this manner, the main FPC 56 is provided with the mounting section 64 that is formed by bending part of the board body 58 and part of the reinforcing plate 62 stuck on the back of the board body. The mounting section 64 is fixed to the carriage assembly 14 by being clamped together with the arms, spacer rings, etc. to the bearing assembly 18 of the carriage assembly. Accordingly, the junction 58a of the main FPC 56 need not be provided with any aperture for screwing, and the effective area of the junction 58a can be increased correspondingly. Even in the case where the number of head signal wires is increased with the improvement in performance of the magnetic heads 32, therefore, a satisfactory connection area can be secured without making the main FPC large-sized.

Since the mounting section 64 is fixed to the carriage assembly 14 in a manner such that it is clamped together with the arms, spacer rings, etc. to the bearing assembly 18, moreover, the main FPC 56 can be fixed firmly to the carriage assembly. This method of fixation, compared with the fixing method that uses an adhesive or a double-coated adhesive tape, is improved considerably in reliability.

Since the main FPC 56 is provided with the grounding section 68 formed on the mounting section 64, furthermore, it can be easily grounded to the carriage assembly 14 by only fixing the mounting section to the carriage assembly.

Figure 10A:
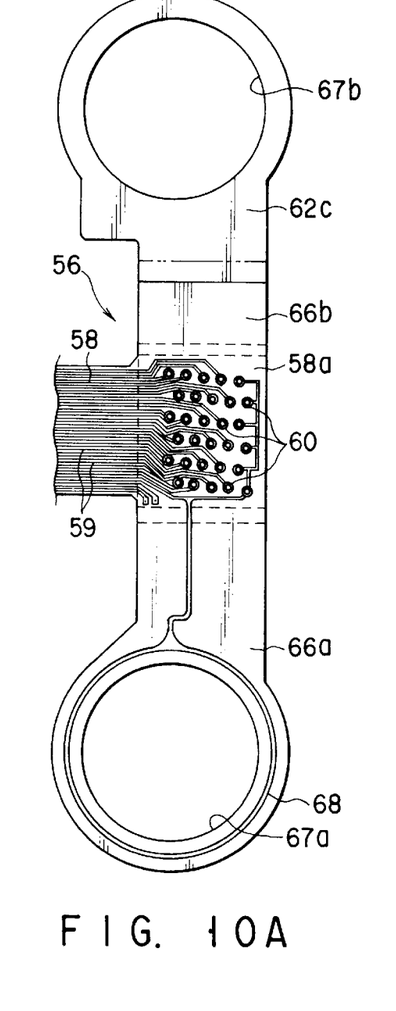
FIG. 10A is a developed plan view of the mounting section.
Figure 10B:
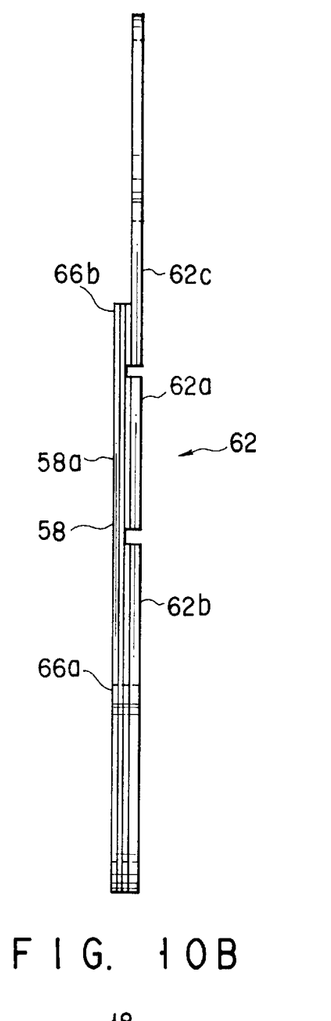
FIG. 10B is a developed side view of the mounting section.
Figure 10C:
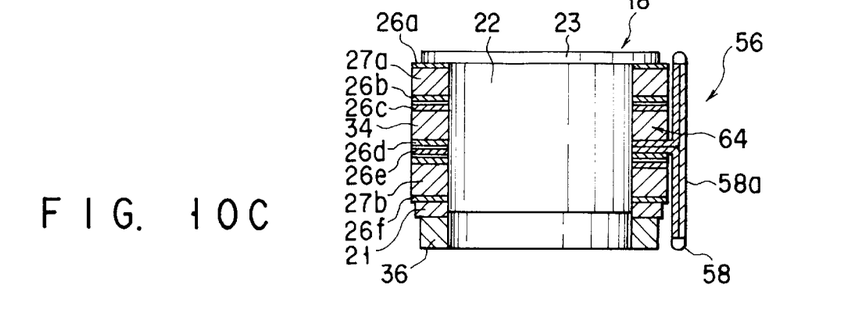
FIG. 10C is a sectional view of a carriage assembly corresponding to FIG. 4.

In the embodiment described above, the mounting section 64 of the main FPC 56 is deviated downward from the center of the junction 58a in the axial direction of the bearing assembly 18. Alternatively, however, the mounting section 64 may be bent so as to extend from the central portion of the junction 58a, as shown FIGS. 10A to 10C. In this case, the mounting section 64 is held between the arm 26d and the support ring 34 when it is fixed to the carriage assembly 14.

Figure 11A:
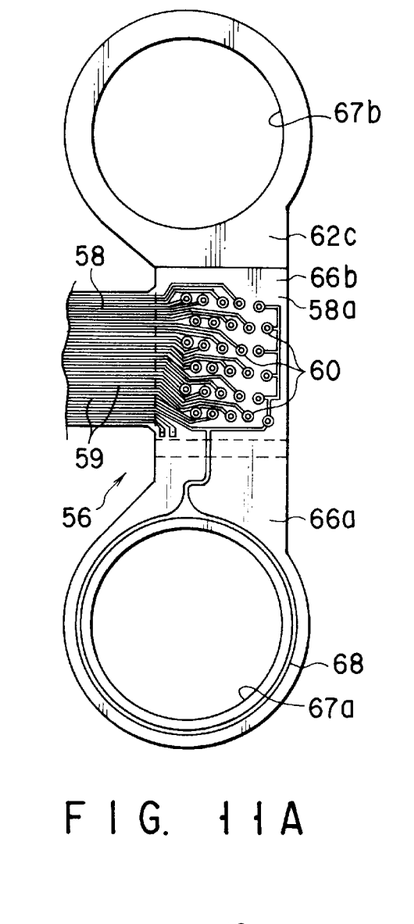
FIG. 11A is a developed plan view of the mounting section.
Figure 11B:
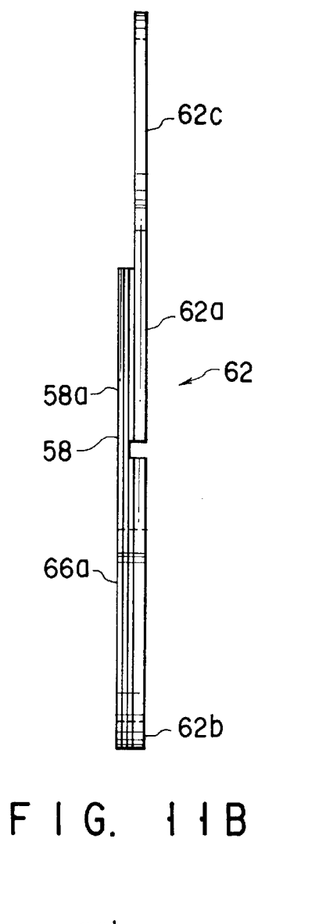
FIG. 11B is a developed side view of the mounting section.
Figure 11C:
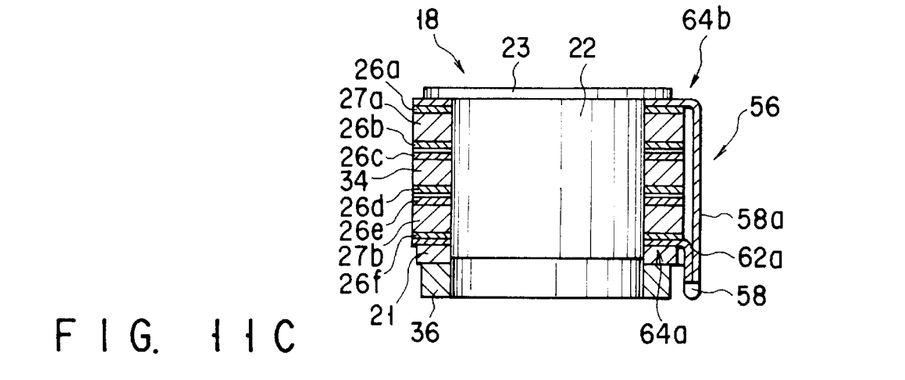
FIG. 11C is a sectional view of a carriage assembly corresponding to FIG. 4.

In the embodiment described above, moreover, the single mounting section 64 is formed by arranging the second and third portions 62b and 62c of the reinforcing plate 62 and the first extension section 66a of the board body 58 in layers. As shown in FIGS. 11A to 11C, however, the second and third portions 62b and 62c of the reinforcing plate 62 may alternatively be bend so as to face each other in parallel relation across a given space. In this case, the main FPC 56 has a mounting section 64a that is formed of the second portion 62b of the reinforcing plate 62 and the first extension section 66a of the board body 58, and a mounting section 64b that is formed of the third portion 62c of the reinforcing plate.

In this arrangement, the mounting section 64a is held between the arm 26f and the washer 21 when it is fixed to the bearing assembly 18, while the mounting section 64b is held between the flange 23 of the hub 22 and the arm 26a when it is fixed to the bearing assembly. In this case, moreover, the first and third portions 62a and 62c of the reinforcing plate 62 are formed integrally without a gap between them.

Figure 12A:
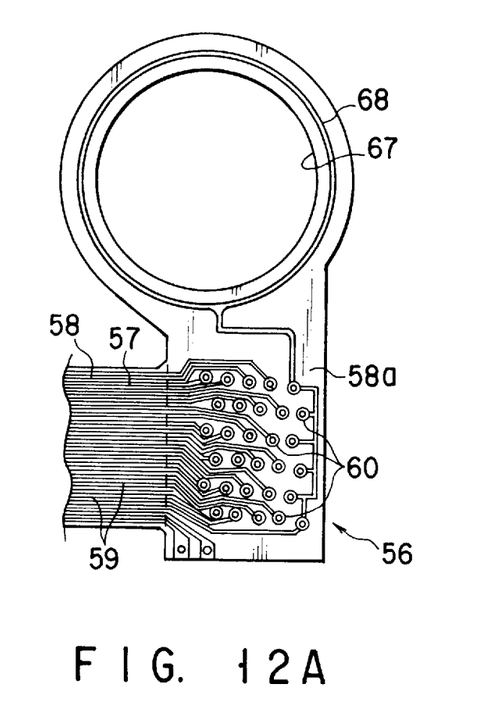
FIG. 12A is a developed plan view of the mounting section.
Figure 12B:
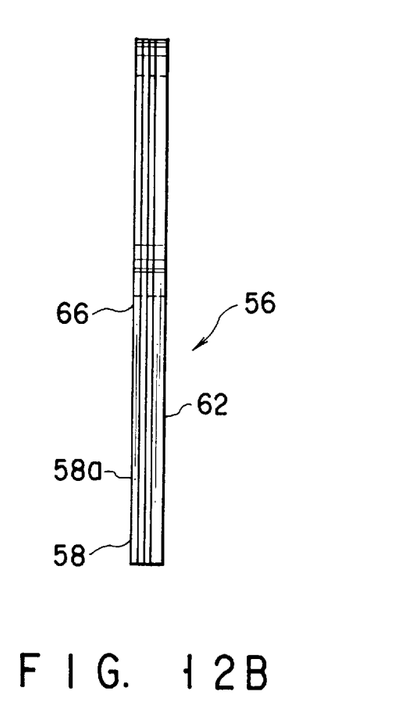
FIG. 12B is a developed side view of the mounting section.
Figure 12C:
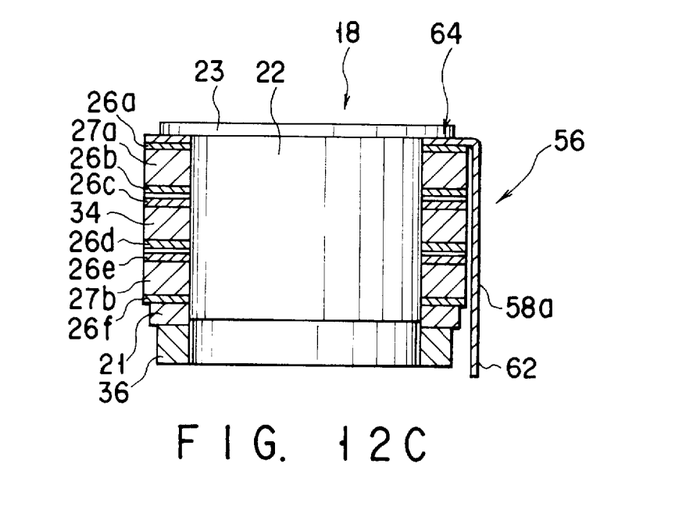
FIG. 12C is a sectional view of a carriage assembly corresponding to FIG. 4.

In the foregoing embodiment, moreover, the board body 58 has the pair of extension sections, which constitutes the mounting section. Alternatively, however, the mounting section 64 may be composed of a single extension section 66 extending from one side of the junction 58a and the reinforcing plate 62 stuck on the back of the extension section, as shown in FIGS. 12A to 12C. In this case, the reinforcing plate 62 is a continuous structure that is stuck on the junction 58a and the extension section 66. The mounting section 64 is fixed to the bearing assembly 18 in a manner such that it is held between the flange 23 of the hub 22 and the arm 26a with the hub 22 passed through an aperture 67 of the extension section 66.

Arranged in this manner, the modifications shown in FIGS. 10A to 12C can provide the same functions and effects of the embodiment described above. For the other components, these modifications are arranged in the same manner as the foregoing embodiment. Therefore, like reference numerals are used to designate like portions throughout the drawings, and a detailed description of those portions will be omitted.

It is to be understood that the present invention is not limited to the embodiment and modifications described above, and that various changes and modifications may be effected therein by one skilled in the art without departing from the scope or spirit of the invention. According to the aforementioned embodiment and modifications, for example, the mounting section of the main FPC is in the form of a ring having the aperture through which the hub of the bearing assembly is passed. The mounting section need not, however, have the shape of a perfect ring, and may be in the form of a partially- or half-cut ring. Moreover, the mounting section need not always be ring-shaped, and may be variously changed in shape, provided it can be held between the arms, spacer rings, hub flange, etc.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

I claim:

1. A magnetic disk apparatus comprising:
a magnetic head for recording on and retrieving information from a magnetic disk;
a carriage assembly supporting the magnetic head for movement with respect to the magnetic disk, and
a flexible printed circuit board having a first portion attached to the carriage assembly and a second portion connected to a substrate unit and connecting the magnetic head electrically to the substrate unit,
the carriage assembly including a bearing section and a plurality of arms stacked on the bearing section, extending from the bearing section, and supporting the magnetic head each,
the flexible printed circuit board including a board body having a conductor pattern thereon and a reinforcing plate fixed on said first portion of the board body, with the first portion of the board body and the reinforcing plate having a mounting section stacked on the bearing section together with the arms,
the conductor pattern of the board body including a grounding section led out to the mounting section and conducting to the carriage assembly.

2. A magnetic disk apparatus comprising:
a magnetic head for recording on and retrieving information from a magnetic disk;
a carriage assembly supporting the magnetic head for movement with respect to the magnetic disk, and
a flexible printed circuit board having a first portion attached to the carriage assembly and a second portion connected to a substrate unit and connecting the magnetic head electrically to the substrate unit,
the carriage assembly including a bearing section and a plurality of arms stacked on the bearing section, extending from the bearing section, and supporting the magnetic head each,
the flexible printed circuit board including a board body having a conductor pattern thereon and a reinforcing plate fixed on said first portion of the board body, with the first portion of the board body and the reinforcing plate having a mounting section stacked on the bearing section together with the arms,
the first portion of the board body including a junction provided with a plurality of connecting pads, and an extension section extending from the junction and constituting the mounting section,
the reinforcing plate being stacked on the junction and the extension section, and
the mounting section including an aperture formed in the extension section and the reinforcing plate and penetrated by the bearing section.

3. A magnetic disk apparatus according to claim 2, wherein the conductor pattern of said board body includes a grounding section extending to the extension section so as to surround the aperture and conducting to the carriage assembly.

4. A magnetic disk apparatus comprising:
a magnetic head for recording on and retrieving information from a magnetic disk;
a carriage assembly supporting the magnetic head for movement with respect to the magnetic disk, and
a flexible printed circuit board having a first portion attached to the carriage assembly and a second portion connected to a substrate unit and connecting the magnetic head electrically to the substrate unit,
the carriage assembly including a bearing section and a plurality of arms stacked on the bearing section, extending from the bearing section, and supporting the magnetic head each,
the flexible printed circuit board including a board body having a conductor pattern thereon and a reinforcing plate fixed on said first portion of the board body, with the first portion of the board body and the reinforcing plate having a mounting section stacked on the bearing section together with the arms,
the first portion of the board body including a junction provided with a plurality of connecting pads, and a pair of extension sections extending from the junction and individually constituting the mounting section,
the reinforcing plate being stacked on the junction and the extension sections, and the mounting section including a pair of apertures formed individually in the extension sections and the reinforcing plate and penetrated by the bearing section.

5. A magnetic disk apparatus according to claim 4, wherein said pair of extension sections are bent with respect to the junction so as to face each other across a given space, and are attached to the bearing section in a manner such that the extension sections and the arms are stacked together.

6. A magnetic disk apparatus according to claim 4, wherein said pair of extension sections are bent with respect to the junction so as to be in contact with each other, and are attached to the bearing section in a manner such that the extension sections and the arms are stacked together.

7. A magnetic disk apparatus according to claim 4, wherein the conductor pattern of the board body includes a grounding section extending to at least one of the extension sections so as to surround the aperture and conducting to the carriage assembly.

8. A magnetic disk apparatus according to claim 4, wherein the reinforcing plate includes a first portion stuck on the junction, and second and third portions stuck individually on the extension sections, the first to third portions being spaced.

* * * * *